May 16, 1961 K. SCHUMPELT ET AL 2,984,595

PRINTED CIRCUIT MANUFACTURE

Filed June 21, 1956

INVENTORS
KARL SCHUMPELT
ALEXANDER KORBELAK

BY

Greene, Pineles & Durr

United States Patent Office 2,984,595

Patented May 16, 1961

2,984,595

PRINTED CIRCUIT MANUFACTURE

Karl Schumpelt, Union, and Alexander Korbelak, Glen Ridge, N.J., assignors to Sel-Rex Precious Metals, Inc., Belleville, N.J., a corporation of New Jersey Filed June 21, 1956, Ser. No. 592,782

4 Claims. (Cl. 154—94)

This invention relates to a process of improving the manufacture of printed circuits and to the printed circuits so produced.

The term, "printed circuit," usually refers to a basic wiring diagram which is so designed that it can be easily duplicated on a large scale by a process involving printing on a base plate (photochemical or silk screen printing, for example). As a general rule the printing provides either a conductive or a nonconductive outline on the base plate which can be electroplated when conductive or which resists electroplating (while the remainder of the plate is plated) when nonconductive. The electroplating process builds up a layer of metal which projects above the surface of the printed base plate. Thus, where the circuit is electroplated onto the final structure a projecting circuit is produced. In order to produce a finished printed circuit in which the circuit elements are flush with the surface of the base plate, a new process has recently been devised wherein a stainless steel base plate is printed with a layer wherein the parts thereof which are to form the circuit are exposed and therefore can receive an electrodeposit whereas the remaining parts are covered by a nonconductive photoresist and therefore do not accept an electrodeposit. In this process the exposed areas of the steel plate receive one or more electrodeposited metals. Thereafter the plated steel matrix is impressed upon a plastic material whereupon the plated circuit is lifted off of the stainless steel base leaving the circuit elements embedded in the surface of the plastic. The stainless steel plate which has been printed once may be used to prepare and transfer a number of printed circuits depending on the wear and tear on the insulating layer. The present invention relates to an improvement in this latter process.

One difficulty connected with the manufacture of printed circuits by the stainless steel base plate and transfer method is that the adherence of the plated circuit to the base plate is erratic. Since it is required that the top layer of the finished circuit be a metal of the platinum group or gold, rhodium has been selected in most cases as the first deposit on the stainless steel base (to become the top layer on the plastic). In many cases the rhodium peels off before a sufficiently heavy backing can be built up and in other cases the rhodium adhered to the base so that the electrodeposited circuit could not be separated from the plate.

Among the objects of the invention is to provide a method of plating rhodium, nickel and copper onto the uninsulated portions of a printed base plate in such a way that the plated metals are transferred to a plastic plate against which the plated base plate is impressed so as to produce an even-surfaced plate containing the circuit partially embedded therein.

The invention is based on the discovery that if a basis metal plate containing insulated areas and conducting areas is first plated with palladium from an ammoniacal bath before plating with rhodium, copper and/or nickel, then the plated circuit will separate from the basis metal plate at the palladium layer without difficulty when the circuit is forced into the surface of the plastic.

The thickness of the palladium layer required is, for example, $1\times10^{-6}$ to $10\times10^{-6}$ inch.

Prior to plating the palladium onto the basis metal plate, the plate may be prepared for plating by dipping into a sensitizing solution comprising a dilute solution (5 to 20%) of a mineral acid and 0.2 to 0.5% of palladium as a palladium salt, such as palladium chloride. The plate is thereafter rinsed and then plated in the ammoniacal palladium bath.

After the palladium layer is obtained the product is next plated with rhodium from a rhodium plating bath, then with nickel from a nickel plating bath and finally with copper from a copper plating bath.

Nickel as ordinarily electroplated has a high tensile stress and therefore, a tendency to curl up and off of the basis plate. To minimize the tendency toward separation the nickel plating bath is controlled so as to plate a compressively stressed nickel.

Also in plating with rhodium a lower stress rhodium is desirable.

The plastic material to which the electroplated or electroformed circuit is transferred may be any insulating plastic such as the polyester, the phenolic or the urea formaldehyde type of thermosetting resins, the thermoplastic resins which have insulating properties such as polystyrene, polyvinyl carbazole, etc., various insulating laminates, etc.

The invention both as to its organization and its method of operation together with additional objects and advantages thereof will best be understood from the following description of specific embodiments thereof when read in connection with the accompanying drawing in which.

Figure 1:
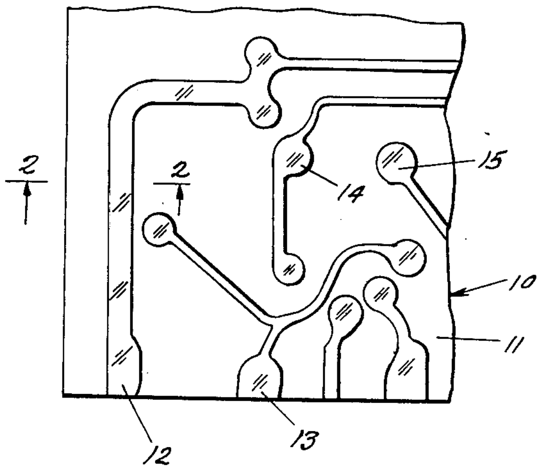
Fig. 1 is a top plan view of a portion of a typical printed circuit diagram on a steel basis plate.
Figure 2:
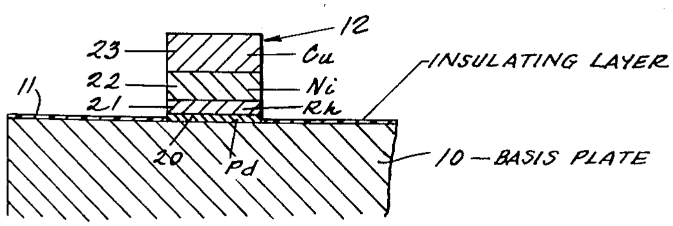
Fig. 2 is a cross-sectional view of the plate of Fig. 1 along line 2—2, with a series of layers of metals deposited thereon according to the invention, the thickness of the layers being greatly exaggerated for the sake of clarity.
Figure 3:
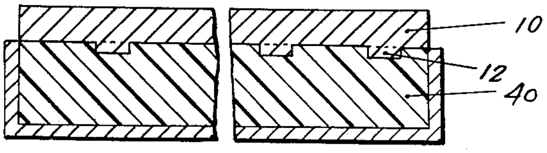
Fig. 3 is a diagram illustrating the step of transferring the plated diagram from the basis metal plate to a plastic insulating base.
Figure 4:
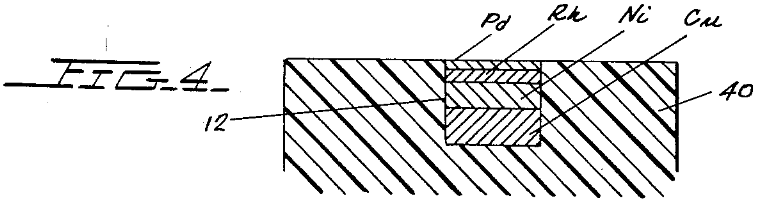
Fig. 4 is a fragmentary cross-sectional view of a portion of a finished circuit in which the thickness of the metals are greatly exaggerated.

The plate 10 of Fig. 1 which is advantageously made of stainless steel has a design imprinted thereon by known methods, for example, by a photographic or a silk screen printing method. The printed design has certain areas 11, which have an insulating layer thereon and certain bare areas 12, 13, 14, 15, for example. When this plate, therefore, is made the cathode in an electroplating bath under the proper operating conditions of the bath, the metal of the bath will deposit on areas 12, 13, 14, 15 etc.

According to the invention a palladium layer 20 of the order of thickness of $1\times10^{-6}$ to $10\times10^{-6}$ inch is first deposited from an ammoniacal palladium bath. Next a layer 21 of rhodium, of the thickness specified by the user of the finished plate, is deposited on the palladium layer. A thickness of the order $50\times10^{-6}$ inch usually acceptable. On top of the rhodium layer a nickel layer 22, of a thickness of .0005" to .001", for example, is deposited. It is important that this layer 22 should be deposited under such conditions that the nickel deposit is under compressive stress. Finally a copper layer 23 approximately .002" thick or whatever thickness is specified by the final user is deposited. The copper 23 is added for its electrical conducting capacity.

After the plating with copper layer 23, the plate 10 is ready to transfer the circuitry layers 20–23 to a plastic base 40. The plastic base 40 may be supported in a receptacle 41, which may be heated, and the plate 10 is pressed into the plastic 40 until the projecting circuit elements 20–23 are embedded in the plastic. Thereafter, the plastic is hardened by cooling or by further condensation of polymerization and on withdrawing the plate 10 from the plastic 40, the circuit elements 20–23 remain in the plastic. The palladium layer provides for ready separation of layers 20–23 from the steel basis plate 10. Heretofore, when a similar process was practiced without a palladium layer, a large proportion of rejects resulted due to the greater adherence of the layers 21–23 to the plate 10 than to the plastic 40.

The following examples further illustrate the invention:

*Example 1*

A stainless steel plate, which has been photographically coated with a printed circuit design in known manner so that the circuit elements are electrically connected to the basis metal whereas the remaining portions have an insulating coating, is provided. This plate is made, the cathode in an electrolytic plating bath comprising, for example, 10–20 g./liter of diammonium phosphate and 5 g./liter of palladium diamminonitrite $Pd(NH_3)_2(NO_2)_2$ (calculated at Pd) for a time sufficient to produce a thin layer of about .000001″ to .00001″ in thickness. The plate is removed from the bath, rinsed and made the cathode in a rhodium plating bath containing, for example, 50–175 g./liter of sulfuric acid and 5–10 g./liter of rhodium metal as sulfate. In order to deposit the rhodium with low internal stress, small amounts of additional inorganic ions (such as 0.2 to 0.3 g./liter of chloride ion) may be added to the bath and the plating bath will be operated at a relatively high temperature of 38–54° C. Instead of rhodium, gold may be employed for this second layer.

After removing the rhodium plated sheet from the bath and rinsing, the plate next is made the cathode in a nickel plating bath. The nickel plating bath is adjusted to deposit the nickel under compressive stress. Such baths are known. For example, the sulfamate type baths containing a small addition of an organic or wetting agent, such as the naphthalene trisulfonic acid compounds are effective in reducing tensile stress in deposits and causing the nickel to deposit under compressive stress. Such baths are disclosed in the article "Nickel Plating From Sulphamate Baths," by Myron B. Diggin, in Metal Progress of October 1954. A very satisfactory bath, for example, contains 270–330 grams per liter of nickel sulphamate, 20–30 g./liter of boric acid as a buffer plus small additions of anti-pitting agents (0.4 g./liter) and (if desired) nickel chloride (30 g./liter, for example) to promote anode corrosion. To this bath about 8–12 g./liter of the stress reducing agent is added. The addition of organic agents such as nickel benzene disulfonate, to the Watts type baths also produce this reversal in stress. (See "Physical Properties of Electrodeposited Metals," by Zentner, Brenner and Jenning, American Electroplaters Society Research Report, Serial No. 20, pages 4, 5, 46 and the references cited in the first paragraph of page 46.) The nickel is deposited in a layer from about 0.0005″ to 0.001″ thick.

After removing the nickel plated plate from the nickel plating bath, it is rinsed and then made the cathode in a copper plating bath. Any type copper plating bath may be employed such as the copper sulfate bath comprising, for example, 150–250 g./liter of copper sulfate and 45–100 g./liter of sulfuric acid. Or a copper cyanide plating bath may be employed. The thickness of the copper layer depends on the specifications of the customer. A very satisfactory thickness is about 0.002″.

The plate is thereafter impressed into a flat mass 40 of hardenable plastic material which is in a plastic condition. When the plastic hardens, the stainless steel sheet is stripped therefrom leaving the metal circuit elements 12, etc., embedded in plastic 40. The metal circuit elements strip easily from the steel plate 10 at the area where the palladium layer joins the steel plate 10 but there is no premature separation of the palladium layer from the stainless steel base.

*Example 2*

The process is conducted as in Example 1 except that the stainless steel plate is sensitized for plating by dipping into an etching solution containing about 10% by volume of hydrochloric acid and 0.2% to 0.5% of palladium as palladium chloride. After rinsing the plate is then treated as in Example 1.

The features and principles underlying the invention described above in connection with specific exemplifications will suggest to those skilled in the art many other modifications thereof. It is accordingly desired that the appended claims shall not be limited to any specific feature or details thereof.

1. In the preparation of printed circuits by the process comprising electroforming at least one circuit element on the exposed area of a stainless steel base member with insulating coating material on other surface portions thereof and, thereafter, transferring and embedding the circuit element in the surface region of a plastic insulating base member, the improvement comprising first plating the exposed areas of the stainless steel base member with a layer of palladium from an ammoniacal bath to a thickness of about $1\times10^{-6}$ to $10\times10^{-6}$ inch, and thereafter plating at least one additional layer of metal over the palladium layer whereby a ready separation between the palladium layer and the stainless steel base is obtained and the exposed surface of each of the resulting circuit elements consists of corrosion resistant palladium when each of said circuit elements embedded in the surface region of the plastic base member is removed together with said plastic base member, from the stainless steel base member.

2. In the process as claimed in claim 1, wherein a plurality of metal layers are plated onto the palladium layer comprising in order, a rhodium layer, a nickel layer and a copper layer, said nickel layer being deposited from a plating bath containing organic wetting agents so as to deposit the nickel under compressive stress.

3. In the process as claimed in claim 2, wherein the rhodium layer is deposited from a bath containing stress relieving agents.

4. In the process as claimed in claim 1, and comprising dipping the steel plate into a bath containing hydrochloric acid and palladium chloride prior to plating with palladium to sensitize the plate for plating with the palladium.

References Cited in the file of this patent

UNITED STATES PATENTS

| | | |
|---|---|---|
| 900,846 | Goodson | Oct. 13, 1908 |
| 1,061,066 | Goodson | May 6, 1913 |
| 1,963,834 | Decker | June 19, 1934 |
| 2,269,523 | Deutsch | Jan. 13, 1942 |
| 2,335,821 | Wise et al. | Nov. 30, 1943 |
| 2,447,541 | Sabee et al. | Aug. 24, 1948 |
| 2,692,190 | Pritikin | Oct. 19, 1954 |
| 2,699,424 | Nieter | Jan. 11, 1955 |
| 2,702,252 | Suchoff | Feb. 15, 1955 |
| 2,783,193 | Nieter | Feb. 26, 1957 |
| 2,874,085 | Brietzke | Feb. 17, 1959 |

OTHER REFERENCES

Transactions of the Electrochemical Society, vol. 80, 1941, pp. 489–498.